United States Patent [19]

Kaneko et al.

[11] 4,005,406
[45] Jan. 25, 1977

[54] DIGITAL-ANALOG CONVERTER

[75] Inventors: Haruo Kaneko; Yoshio Katagiri; Kaoru Yano, all of Tokyo, Japan

[73] Assignee: Nippon Electric Company, Ltd., Tokyo, Japan

[22] Filed: July 15, 1974

[21] Appl. No.: 488,859

[30] Foreign Application Priority Data

July 14, 1973 Japan .............................. 48-79420

[52] U.S. Cl. ....................... 340/347 DA; 179/170.2
[51] Int. Cl.$^2$ ........................................ H03K 13/02
[58] Field of Search ........... 340/347 DA; 179/170.2

[56] References Cited
UNITED STATES PATENTS

| | | | |
|---|---|---|---|
| 3,487,304 | 12/1969 | Kennedy | 340/347 DA |
| 3,540,037 | 11/1970 | Ottesen | 340/347 DA |
| 3,894,200 | 7/1975 | Campanella et al. | 179/170.2 |

OTHER PUBLICATIONS

Analog Devices, Inc., "Analog–Digital Conversion Handbook," 6/72, pp. I-106, I-107, II-1 to II-10.
Analog Devices, Inc., "Analog–Digital Conversion Handbook," 6/1972, pp. II-4 to II-9, II-122, II123.

*Primary Examiner*—Thomas J. Sloyan
*Attorney, Agent, or Firm*—Sughrue, Rothwell, Mion, Zinn & Macpeak

[57] ABSTRACT

A digital-analog converter is provided wherein a digital signal from an analog-digital converter is compared with a predetermined value and is suppressed to zero if it is smaller than the predetermined value, the resulting digital signal being converted into a corresponding analog signal. The converter is useful particularly in communication networks, serving to improve communication quality in terms of noise by suppressing input signals of amplitudes below a certain level. This invention avoids the need for an analog delay circuit as required by a conventional analog-type device.

8 Claims, 7 Drawing Figures

FIG.4
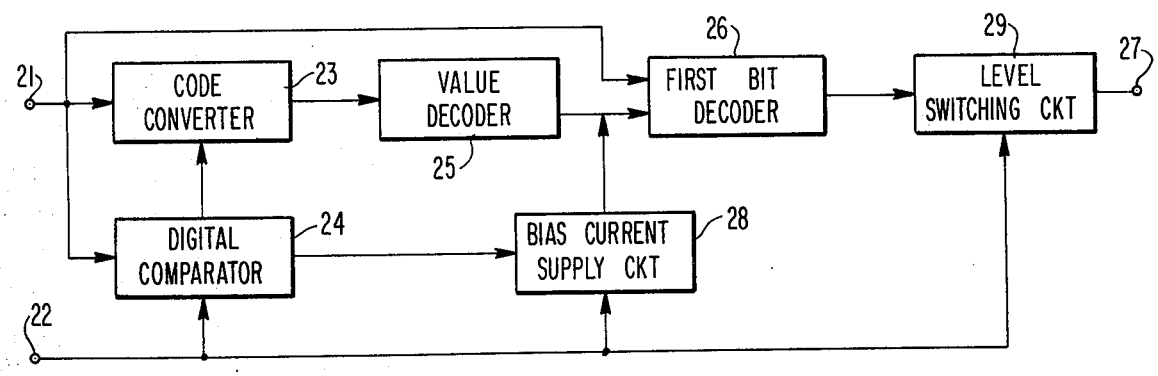
FIG.5a
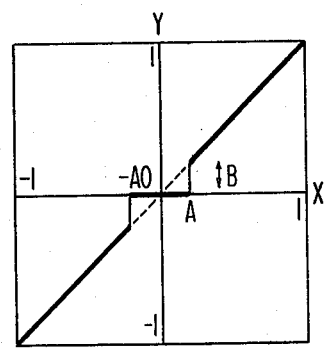
FIG.5b
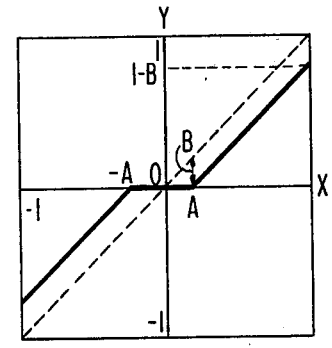
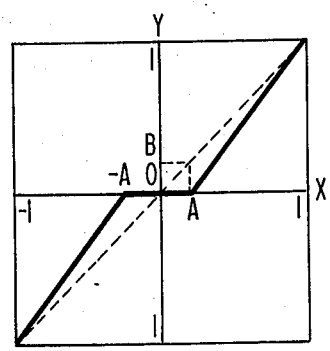
FIG.5c

DIGITAL-ANALOG CONVERTER

The present invention relates to a digital-analog converter. In communication networks it is often necessary that various disturbances, such as noise generated at transmitting stations or introduced in transmission paths should not appear at the output of receiving stations. These requirements should be met because if a disturbance noise such as echo is received during a period of pause in which no information is being transmitted, then degradation of communication quality would result. For example in a satellite transmission system, an echo suppressor or canceller is used for minimizing the echo noise when the transmitting signal level is lower than the received signal level. It is, however, impossible to perfectly eliminate the echo noise only by the supressing or cancelling operation of the echo suppressor or canceller. Therefore, the conventional echo suppressor or canceller includes a level suppression circuit for forcedly interrupting the transmission of the suppressed echo noise. The level suppression circuit operates only when a controlled signal is generated to define a period when the transmitting signal level is lower than the received signal level. For further background in this area, see U.S. Pat. Nos. 3,787,645 and 3,828,147.

An object of the present invention is to provide a digital-analog converter for efficiently suppressing the lower level signals in digital fashion.

SUMMARY OF THE INVENTION

In accordance with the present invention, there is provided a novel digital-analog converter wherein a digital signal from an analog-digital converter is compared with a predetermined value and is suppressed to zero if it is smaller than the predetermined value, the resulting digital signal being converted into a corresponding analog signal. The converter is useful particularly in communication networks, serving to improve communication quality in terms of noise by suppressing input signals of amplitudes below a certain level. Further, this invention avoids the need for an analog delay circuit as required by a conventional analog-type device.

BRIEF DESCRIPTION OF THE DRAWINGS

FIGS. 3 and 4 are block diagrams showing respectively modified embodiments of the present invention; and FIGS. 5a, 5b and 5c are diagrams showing input-output conversion characteristics, being useful for explaining the operations of said respective embodiments of the present invention.

DETAILED DESCRIPTION OF PREFERRED EMBODIMENTS

Before describing more specifically the concept of the present invention, it would be helpful to discuss the construction and operation of the prior art system.

Figure 1:
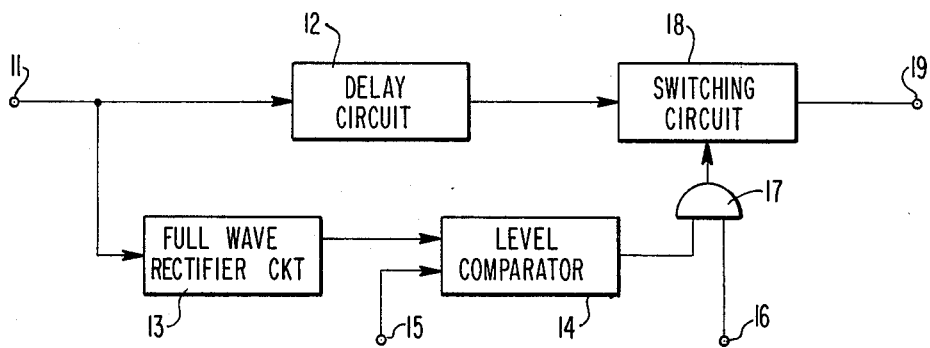
FIG. 1 is a block diagram showing a conventional level suppression circuit.

Heretofore, in an analog signal transmission system, a particular circuit for realizing the aforementioned suppression function has been used. Referring to FIG. 1 which illustrates a conventional level suppression circuit, an input analog signal is applied at an input terminal 11 and is rectified in a full-wave rectifier circuit 13 to be converted into a unidirectional signal representing the absolute value of the input analog signal. A level comparator 14 determines whether or not the input analog signal is lower than a reference voltage supplied from a terminal 15, and delivers the result of such determination from its output. An AND circuit 17 delivers a logical product of the resulting output signal and a control signal fed from a terminal 16 to drive a switching circuit 18. This switching circuit 18 interrupts the passage of the input analog signal incoming thereto through a delay circuit 12 when the logical product is "1". Whereas when the logical product is not "1", the input analog signal itself appears at an output terminal 19. Thus, the input analog signals which are lower than a threshold level corresponding to the reference voltage are suppressed to zero level when the control signal is applied.

Accordingly, it will be understood that the above-described level suppression circuit requires a delay circuit as indicated at 12 for the purpose of delaying the input analog signal by a time period equivalent to the delay time introduced in the rectifier circuit, and level comparator and the AND circuit, and also requires a switching circuit which is of high quality in terms of distortion, noise and the like because it must be inserted in the signal transmission path.

Figure 2:
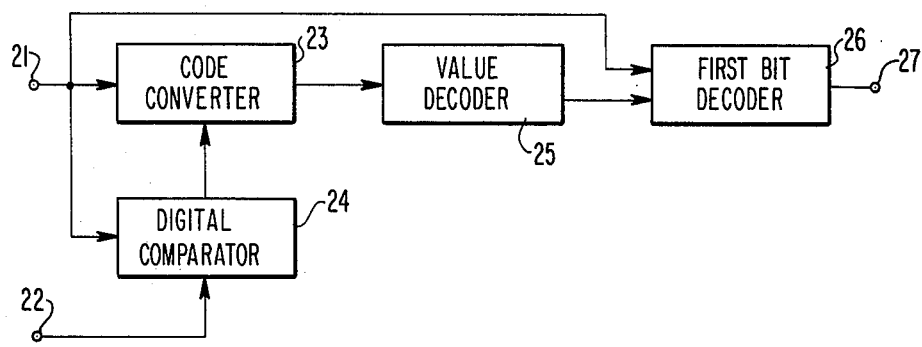
FIG. 2 is a block diagram showing one preferred embodiment of the present invention, which includes a center clipping circuit operating in digital fashion.

Now, referring to FIG. 2 which shows one preferred embodiment of the present invention, input digital signals in the form of so-called folded binary codes are applied at an input terminal 21 and are fed to a digital comparator 24. The function of the digital comparator 24 is to detect low level indicating digital signals corresponding to analog signals of absolute amplitudes smaller than a predetermined value. If a control signal is fed from a terminal 22 and if one of the low level indicating digital signals is simultaneously detected, then a digital code converter circuit 23 is enabled to convert this detected digital signal into a zero indicating digital signal corresponding to a zero analog output. Input digital signals other than the low level indicating digital signals are transferred to the output of the code converter 23, as they are. Then, the digital signals subjected to the above-described operations are converted into analog signals by a conventional absolute value decoder 25 which provides the absolute value of the analog signal, and by a conventional first bit decoder 26 for performing polarity inversion, in response to polarity indicating bits of the input digital signals to thereby deliver the decoded analog output signal at a terminal 27. If the input digital signals are given in the form of the so-called natural binary codes, the output signals of the digital code converter 23 are converted to corresponding analog signals by a conventional decoder suitable for the natural binary codes, rather than by the decoders as indicated at 25 and 26.

In the case of the embodiment shown in FIG. 2, the input-output characteristics of the digital-analog converter take the form shown in FIG. 5a, wherein the X-axis represents a normalized input digital signal and the Y-axis, a normalized output analog signal. In addition, reference character A represents a threshold digital value corresponding to the predetermined value as described above, and reference character B represents an output analog signal corresponding to the input digital value A. The input-output characteristics obtained when the control signal is not applied, have a completely linear response as represented by the solid lines in the regions of $-1 \leq X \leq -A$ and $A \leq X \leq 1$ and by the dash line in the region of $-A \leq X \leq A$. In case that the control signal is applied, $Y = X$ in the regions of $-1 \leq X \leq -A$ and $A \leq X \leq 1$ as represented by the solid lines and $Y = 0$ in the region of $-A \leq X \leq A$ as represented by the solid line.

The digital code converter 23 can be easily realized by a conventional logic circuitry. Also, the digital comparator 24, which is capable of processing eight bit input code signals, can be realized by employing three pieces of SN7485 type integrated circuits put on the market by Texas Instruments Co.. Therefore, no further explanation thereof will be necessary.

Figure 3:
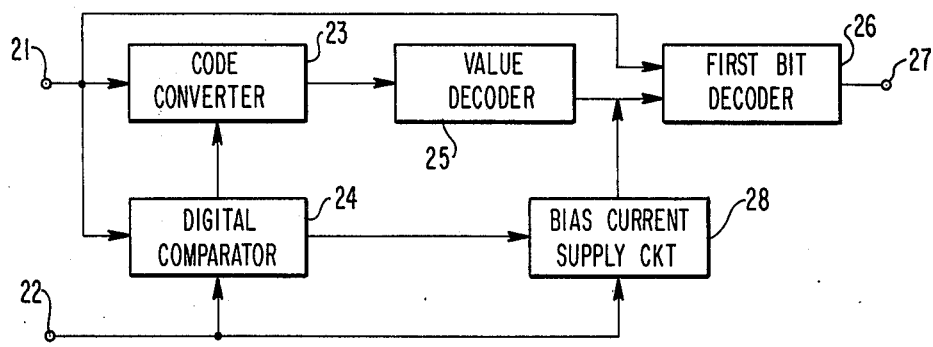

It is often preferable in view of communication quality that the input-output characteristic obtained when the control signal is applied, is represented by a continuous curve as shown in FIG. 5b. A modified embodiment therefor is shown in FIG. 3. At the output of the absolute value decoder 25 there is additionally provided a bias current supply circuit 28 for supplying in response to the control signal a bias current of either +B or -B except when the low-level indicating digital signal is detected, and said bias current supply circuit 28 is so designed as to supply a bias current of -B when the absolute value decoder 25 delivers the positive output, and to supply a bias current of +B when the decoder delivers the negative output. In this case, the input-output characteristic obtained when no control signal is present satisfies the relation of $Y = X$ as represented by the dash line in FIG. 5b, whereas when the control signal if fed, the input-output characteristic is modified as shown by the continuous solid lines and the operating range of the output Y becomes the range of $-(1 - B) \sim +(1 - B)$. This implies that the operating range varies depending upon whether or not the control signal exists.

Although the last-mentioned characteristics are substantially satisfactory in the case of practical transmission lines, there sometimes occurs a further demand that desirably the operating range of the output Y should be normalized to exactly extend over $-1 \sim +1$ regardless of the presence or absence of the control signal. Such demand will be satisfied by realizing the input-output characteristics as shown in FIG. 5c through utilization of, a circuit construction as shown in FIG. 4, which is another modified embodiment of the present invention.

In FIG. 4, it is only necessary to add a level switching circuit 29 which is adapted to provide a gain of $1/(1-B)$ when the control signal is present while it may have a gain of unity when the control signal is not present.

Therefore, as described above, according to the present invention there exists an advantage that the aforementioned desired characteristics can be realized through digital operations by a digital-analog converter which is simple in construction and of entirely digital type. Furthermore, in contrast to the prior art system relying upon analog operations, there exist further advantages that since the reference level for a comparator circuit can be defined in a digital form, said reference level can be established stably and accurately, and that no such troublesome circuits as an analog delay circuit for which the degradation of performance must be taken into consideration, are necessary.

What is claimed is:

1. A digital-analog converter serving to improve quality in terms of noise by suppressing low level indicating digital input signals corresponding to analog amplitudes below a predetermined absolute value below which said low level indicating digital input signals are assumed to be uncertain but providing conversion of high level indicating digital input signals corresponding to analog amplitudes greater than said predetermined absolute value, said converter comprising:
   means for detecting said low level indicating digital input signals corresponding to analog signals whose absolute amplitudes are smaller than said predetermined absolute value and for delivering a detection output signal upon detection of such low level indicating digital input signals, said predetermined absolute value being different from zero;
   code converting means for converting said low level indicating digital input signals to a zero code signal when said detection output signal is delivered and, in the absence of said detection output signal, for delivering as the output signal thereof said high level indicating digital input signals corresponding to analog signals whose absolute amplitudes are larger than said predetermined absolute value; and
   digital-to-analog converting means for converting the output digital signals from said code converting means into corresponding analog signals.

2. A digital-analog converter according to claim 1, wherein said first means is adapted to be enabled in response to a control signal.

3. A digital-analog converter according to claim 1, wherein said digital-to-analog converting means comprises:
   means responsive to said digital output of said code converting means for providing a first signal representing the absolute value of the corresponding analog signal; and
   means responsive to said input digital signals for providing a second signal representing the polarity of said corresponding analog signals, and for combining said first and second signals to provide said corresponding analog signals.

4. A digital-analog converter according to claim 3, further comprising:
   means for providing a bias of a predetermined magnitude to be applied to said first signal in the absence of said detection output signal.

5. A digital-analog converter according to claim 4, wherein said biasing means is adapted to be enabled in response to a control signal.

6. A digital-analog converter according to claim 5, wherein said bias of a predetermined magnitude is applied additively to said first signal when said first signal is a positive signal, and said bias is applied subtractively to said first signal when said first signal is a negative signal.

7. A digital-analog converter according to claims 3, further comprising:
   means for providing a bias of varying magnitude to be applied to said first signal in the absence of said detection output signal.

8. A digital-analog converter according to claim 7, wherein said bias of varying magnitude is applied additively to the output of said signal combining means when said output is a positive signal, and said bias is applied subtractively to the output of said signal combining means when said output is a negative signal, said bias being at zero value when the output of said signal combining means is at zero value said bias increasing at a constant rate with the increase of the absolute value of said output.

* * * * *

UNITED STATES PATENT AND TRADEMARK OFFICE
CERTIFICATE OF CORRECTION

PATENT NO. : 4,005,406
DATED : January 25, 1977
INVENTOR(S) : Haruo Kaneko; Yoshio Katagiri; Kaoru Yano It is certified that error appears in the above-identified patent and that said Letters Patent are hereby corrected as shown below:

Column 1      After title and before first paragraph insert
-- BACKGROUND OF THE INVENTION --
line 9 - delete "noise" (first occurrence)

Column 2 line 24 - delete "and" and insert -- the --

Column 3, line 32 - delete "if" and insert -- is --
line 46 - after "of" delete comma
line 66 - after "consideration" delete the comma Column 4, line 50 - delete "first" (second Occurrence)
insert -- second --
line 52 - delete "first" (second occurrence)
insert -- second --

UNITED STATES PATENT OFFICE
CERTIFICATE OF CORRECTION

Patent No. 4,005,406      Dated January 25, 1977

Inventor(s) Haruo Kaneko et al

It is certified that error appears in the above-identified patent and that said Letters Patent are hereby corrected as shown below:

Column 4, line 54, "claims" should read -- claim --.

line 66, after "value" insert -- , --.

Signed and Sealed this

Thirty-first Day of May 1977

[SEAL]

Attest:

RUTH C. MASON
*Attesting Officer*

C. MARSHALL DANN
*Commissioner of Patents and Trademarks*